(12) United States Patent
Chuang et al.

(10) Patent No.: US 11,238,207 B2
(45) Date of Patent: Feb. 1, 2022

(54) METHOD AND SYSTEM FOR FABRICATING INTEGRATED CIRCUIT WITH AID OF PROGRAMMABLE CIRCUIT SYNTHESIS

(71) Applicant: TAIWAN SEMICONDUCTOR MANUFACTURING COMPANY LTD., Hsinchu (TW)

(72) Inventors: Yung-Hsu Chuang, Hsinchu (TW); Wen-Shen Chou, Hsinchu County (TW); Jie-Ren Huang, Hsinchu (TW); Yu-Tao Yang, Hsinchu County (TW); Yung-Chow Peng, Hsinchu (TW); Yun-Ru Chen, Keelung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/103,724

(22) Filed: Nov. 24, 2020

(65) Prior Publication Data

US 2021/0081594 A1 Mar. 18, 2021

Related U.S. Application Data

(63) Continuation of application No. 16/443,055, filed on Jun. 17, 2019, now Pat. No. 10,860,777.

(51) Int. Cl.
*G06F 30/398* (2020.01)
*G06F 30/36* (2020.01)
(Continued)

(52) U.S. Cl.
CPC .......... *G06F 30/398* (2020.01); *G06F 30/327* (2020.01); *G06F 30/36* (2020.01);
(Continued)

(58) Field of Classification Search
CPC ...... G06F 30/398; G06F 30/36; G06F 30/327; G06F 30/367; G06F 30/392;
(Continued)

(56) References Cited

U.S. PATENT DOCUMENTS

| 4,595,943 | A  | * | 6/1986 | Morcom  | H01L 29/1004 257/555 |
| 6,198,324 | B1 | * | 3/2001 | Schober | H01L 27/0207 327/202 |

(Continued)

OTHER PUBLICATIONS

Habal, "Constraint-Based Layout-Driven Sizing of Analog Circuits", Technische Univeritat Munchen, Apr. 4, 2012, 180 pages. (Year: 2012).*

*Primary Examiner* — Phallaka Kik
(74) *Attorney, Agent, or Firm* — WPAT, P.C., Intellectual Property Attorneys; Anthony King

(57) ABSTRACT

A method for fabricating an integrated circuit is provided. The method includes: receiving a cell schematic of a unit cell of the integrated circuit; when an intrinsic gain of a transistor of the unit cell falls outside a predetermined range of gain values, revising a set of parameter values for a set of size parameters of the unit cell in the cell schematic, wherein the intrinsic gain of the transistor of the unit cell characterized by the revised set of parameter values falls within the predetermined range of gain values; generating a cell layout of the unit cell according to the cell schematic indicating the revised set of parameter values for the set of size parameters; and fabricating the integrated circuit according to the cell layout of the unit cell.

20 Claims, 12 Drawing Sheets

(51) Int. Cl.
*G06F 30/327* (2020.01)
*G06F 30/367* (2020.01)
*G06F 30/392* (2020.01)
*G06F 30/394* (2020.01)
*G06F 30/3308* (2020.01)
*G06F 30/337* (2020.01)
*G06F 30/373* (2020.01)

(52) U.S. Cl.
CPC .......... *G06F 30/367* (2020.01); *G06F 30/392* (2020.01); *G06F 30/394* (2020.01); *G06F 30/337* (2020.01); *G06F 30/3308* (2020.01); *G06F 30/373* (2020.01)

(58) Field of Classification Search
CPC .. G06F 30/394; G06F 30/3308; G06F 30/337; G06F 30/373
USPC .................... 716/111, 106, 119, 132; 703/16
See application file for complete search history.

(56) References Cited

U.S. PATENT DOCUMENTS

| | | | | |
|---|---|---|---|---|
| 10,860,777 | B1 * | 12/2020 | Chuang | ................. G06F 30/392 |
| 2007/0252643 | A1 * | 11/2007 | Nishimoto | ............. G06F 30/36 |
| | | | | 327/574 |

* cited by examiner

METHOD AND SYSTEM FOR FABRICATING INTEGRATED CIRCUIT WITH AID OF PROGRAMMABLE CIRCUIT SYNTHESIS

PRIORITY CLAIM AND CROSS-REFERENCE

The present application is a continuation application of U.S. patent application Ser. No. 16/443,055 filed on Jun. 17, 2019, which is incorporated herein by reference in its entirety.

BACKGROUND

The present disclosure relates to circuit design and, more particularly, to a method for fabricating an integrated circuit with the aid of programmable circuit synthesis, and a system for fabricating an integrated circuit.

An integrated circuit (IC), also referred to as a microelectronic circuit, a microchip or a chip, is an assembly of electronic components integrated into a thin substrate of semiconductor material. The electronic components can include miniaturized active circuit elements and passive circuit devices. Integrated circuits can be classified into analog integrated circuits, digital integrated circuits and analog/mixed-signal (AMS) integrated circuits according to the type of signals used in the integrated circuits. An AMS integrated circuit is a combination of analog and digital circuitry on a single chip. AMS integrated circuits are widely used for applications such as internet of things (IoT), cellular phone systems or other high speed electronic systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
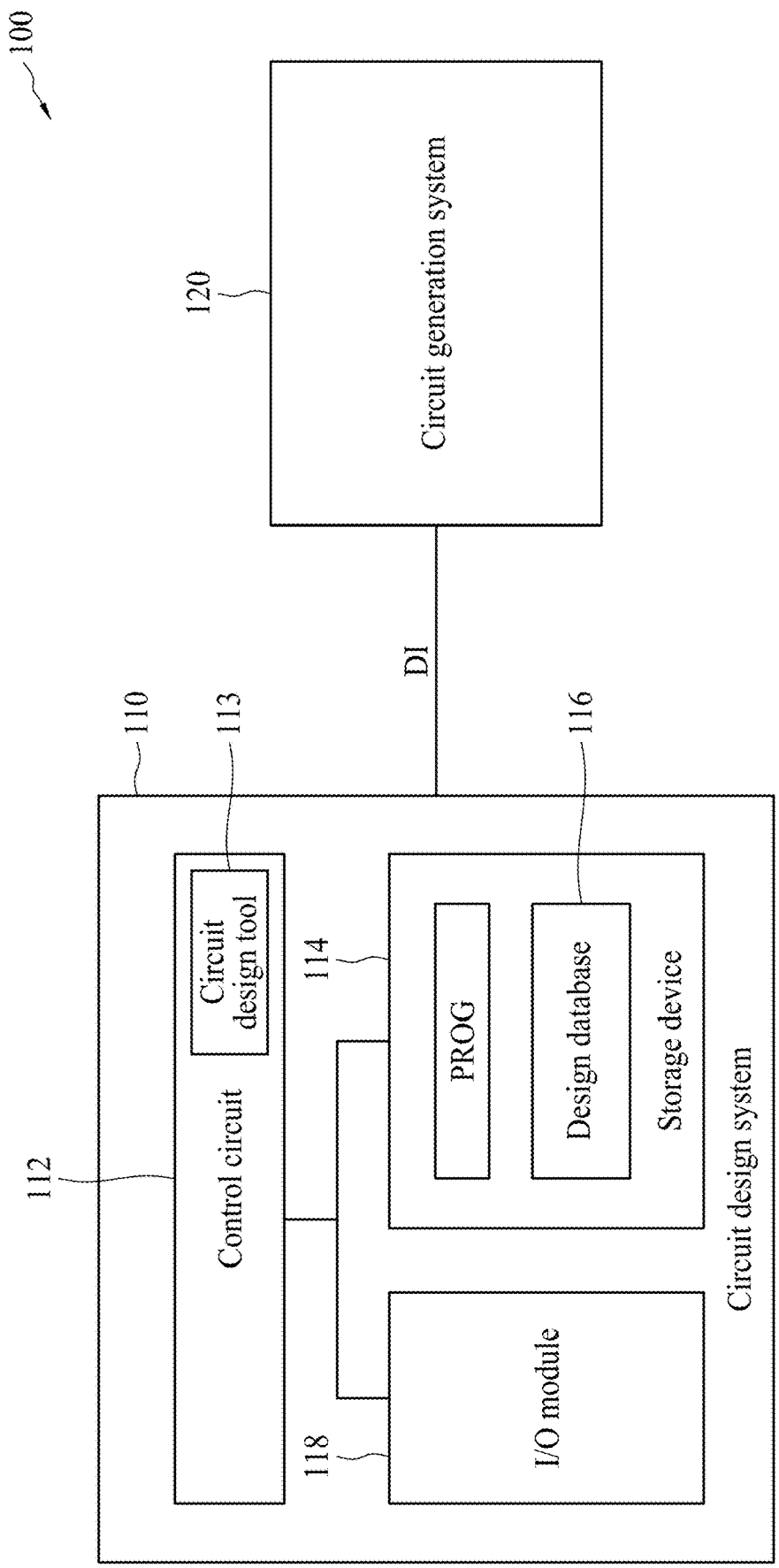
FIG. 1 illustrates an exemplary system for fabricating an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, it will be understood that when an element is referred to as being "connected to" or "coupled to" another element, it may be directly connected to or coupled to the other element, or intervening elements may be present.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

AMS circuit designs utilize a more complex flow than strictly digital designs. During an AMS design process, a circuit designer has to repeatedly and manually modify circuit schematics and corresponding circuit layouts in order to find optimized design parameters. For example, the circuit designer may create a schematic design of an AMS integrated circuit. The circuit designer assigns respective device sizes to circuit elements of the AMS integrated circuit according to a performance specification and a given technology node. A pre-layout simulation is performed upon the schematic design to simulate performance of the AMS integrated circuit. If the simulated performance does not satisfy the performance specification, the circuit designer has to modify at least one of the device sizes in the schematic design, and enables the pre-layout simulation again to determine if the performance specification can be satisfied. However, as the device size selection of the circuit elements heavily depends on the experience and knowledge of the circuit designer, the device sizes are often modified multiple times before the simulated performance can satisfy the performance specification.

When the simulated performance satisfies the performance specification, a layout design is generated according to the schematic design which may have, been modified multiple times. A post-layout simulation is performed on the layout design. In contrast to the pre-layout simulation where layout-dependent effects (LDEs) of the AMS integrated circuit are not taken into account, the LDEs are incorporated into the post-layout simulation such that the resulting simulated performance can reflect actual circuit response more accurately. If the post-layout simulation determines that the layout design does not satisfy the performance specification, the circuit designer has to interpret the simulation performance, and revises at least one of the layout design and the schematic design based on his or her own experience. As a result, not only the schematic design but also the layout design is iteratively modified until both the pre-layout and post-layout simulation results satisfy the performance specification. The aforementioned trial-and-error process leads to a waste of human resources and increases manufacturing costs.

The present disclosure describes exemplary methods for fabricating an integrated circuit with the aid of programmable circuit synthesis. The programmable circuit synthesis can be performed based on a unit cell of the integrated circuit. For example, the integrated circuit may include a plurality of unit cells each having a similar/identical circuit structure. Each unit cell has programmable design parameters. Before creating a circuit design of the integrated circuit, the exemplary methods can create a suitable or optimized circuit design of a unit cell by determining suitable or optimized design parameter values for the unit cell. By assigning the determined circuit design of the unit cell to other unit cells, the exemplary methods can synthesize a suitable or optimized circuit design of the integrated circuit without manual iterations.

In some embodiments, the integrated circuit may be an analog integrated circuit or an AMS integrated circuit. A unit cell of the integrated circuit may be an analog circuit cell or an AMS circuit cell. The exemplary methods can provide programmable analog synthesis to fabricate the integrated circuit. In some embodiments, a circuit design of a unit cell may include at least one of a schematic representation and a layout representation of the unit cell.

With the use of unit-cell-based programmable circuit synthesis, the exemplary methods can realize an automated circuit design flow to save time and reduce cost. Further description is provided below.

FIG. 1 illustrates an exemplary system for fabricating an integrated circuit in accordance with some embodiments of the present disclosure. The system 100 can provide a programmable circuit synthesis platform to realize an automated design flow. In the present embodiment, the integrated circuit (not shown in FIG. 1) can be an analog integrated circuit or an AMS integrated circuit, and the programmable circuit synthesis platform can be a programmable analog synthesis platform. Those skilled in the art will recognize the system 100 can be applied to fabricate other types of integrated circuits without departing from the scope the present disclosure.

The system 100 includes, but is not limited, a circuit design system 110 and a circuit generation system 120. The circuit design system 110 is configured to provide design information DI of the integrated circuit for the circuit generation system 120. The circuit generation system 120 is configured to implement the integrated circuit according to the design information DI. By way of example but not limitation, the circuit generation system 120 is configured to form a circuit on a substrate using a plurality of photomasks in a multi-patterning deposition process and/or other suitable circuit manufacturing process according to a layout design included in the design information DI.

In the present embodiment, the circuit design system 110 includes, but is not limited to, a control circuit 112, a storage device 114 and an input/output (I/O) module 118. The control circuit 112, including at least one processor or at least one controller, is operative to control operations of the circuit design system 102. For example, the control circuit 112 may include central processing unit(s), graphic processing unit(s), general purpose processor(s), digital signal processor(s), microprocessor(s) or other types of processors. As another example, the control circuit 112 may include microcontroller(s), application specific integrated circuit(s), field programmable gate array(s), programmable logic device(s) or other types of controllers.

The storage device 114 may include any non-transitory computer readable medium capable of storing data, instructions, software programs, or combinations thereof. For example, the storage device 114 may be implemented by a memory device including a read-only memory (ROM), a random access memory (RAM), a flash memory, a content addressable memory (CAM), a disk memory, a memory card or any other types of memory devices suitable for storing information. In the present embodiment, the storage device 114 may store program code PROG, i.e. a set of execution instructions, which causes the control circuit 112 to execute circuit design operations of a circuit design tool 113. The circuit design operations may include at least one of schematic generation, layout generation, design rule verification and post-layout simulation. The circuit design tool 113 may include at least one of a computer aided design (CAD) tool and an electronic design automation (EDA) tool. The storage device 114 may also store a circuit design database 116 for the circuit design operations.

The I/O module 118 can be configured to receive input signals for designing the integrated circuit, and output associated information during a design process. By way of example but not limitation, the I/O module 118 may include a keyboard, a mouse, a display, a touch screen, other types of I/O devices, or combinations thereof. When the program code PROG is executed, the control circuit 112 may control the I/O module 118 to display a graphic user interface associated with the circuit design tool 113 launching in the circuit design system 110.

In some embodiments, the circuit design database 116 may store design data associated with a plurality of circuit cells. When executed by the control circuit 112, the program code PROG can cause the control circuit 112 to create a circuit design of a unit cell of the integrated circuit according to design data associated with a circuit cell, which has a circuit structure similar/identical to a circuit structure of the unit cell. For example, the design data associated with the circuit cell may include different circuit characteristics possessed by the circuit cell of different cell sizes. The program code PROG may include one or more algorithms, such as artificial intelligence (AI) algorithms, to facilitate optimization of the circuit design. As a result, the program code PROG can cause the control circuit 112 to select one of the cell sizes, which corresponds to a circuit characteristic satisfying performance specifications, as a cell size of the unit cell, thereby creating a suitable/optimized circuit design of the unit cell. Also, the control circuit 112 can refer to the circuit design of the unit cell to generate respective circuit designs of other unit cells of the integrated circuit, thereby generating a suitable/optimized circuit design of the integrated circuit without timing consuming trial-and-error iterations.

In some embodiments, the control circuit 112 can be configured to generate design data associated with one or more circuit cells stored in the circuit design database 116. For example, the control circuit 112 can perform circuit simulation upon a circuit cell of different cell sizes, and store corresponding circuit characteristics possessed by the circuit cell into the circuit design database 116. When executed by the control circuit 112, the program code PROG can cause the control circuit 112 to access the circuit design database 116 to create a suitable/optimized circuit design for a unit cell of the integrated circuit.

Figure 2A:
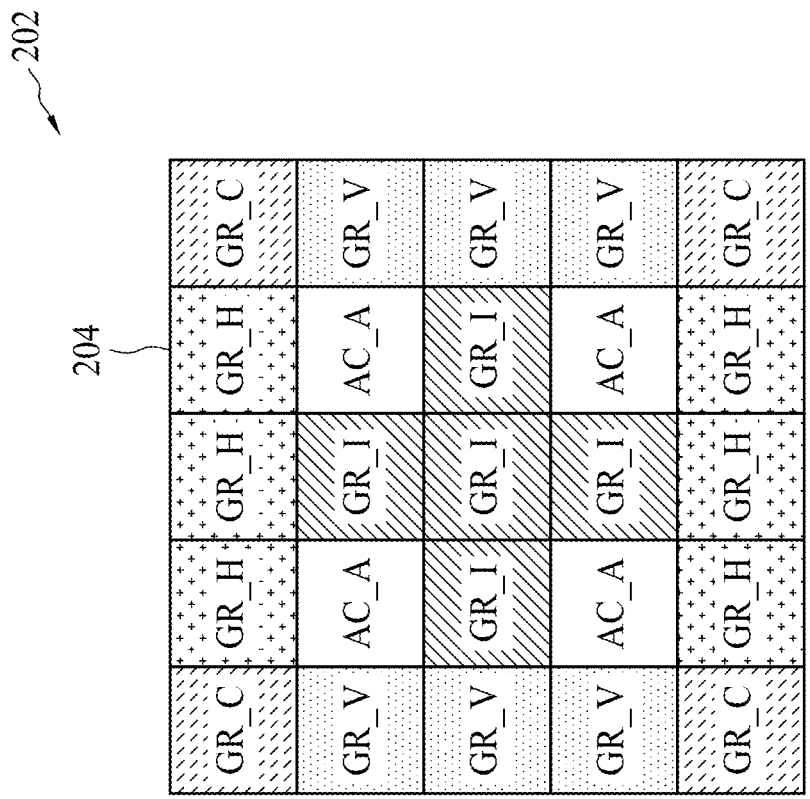
FIG. 2A illustrates an exemplary circuit floorplan of an integrated circuit in accordance with some embodiments of the present disclosure.
Figure 2B:
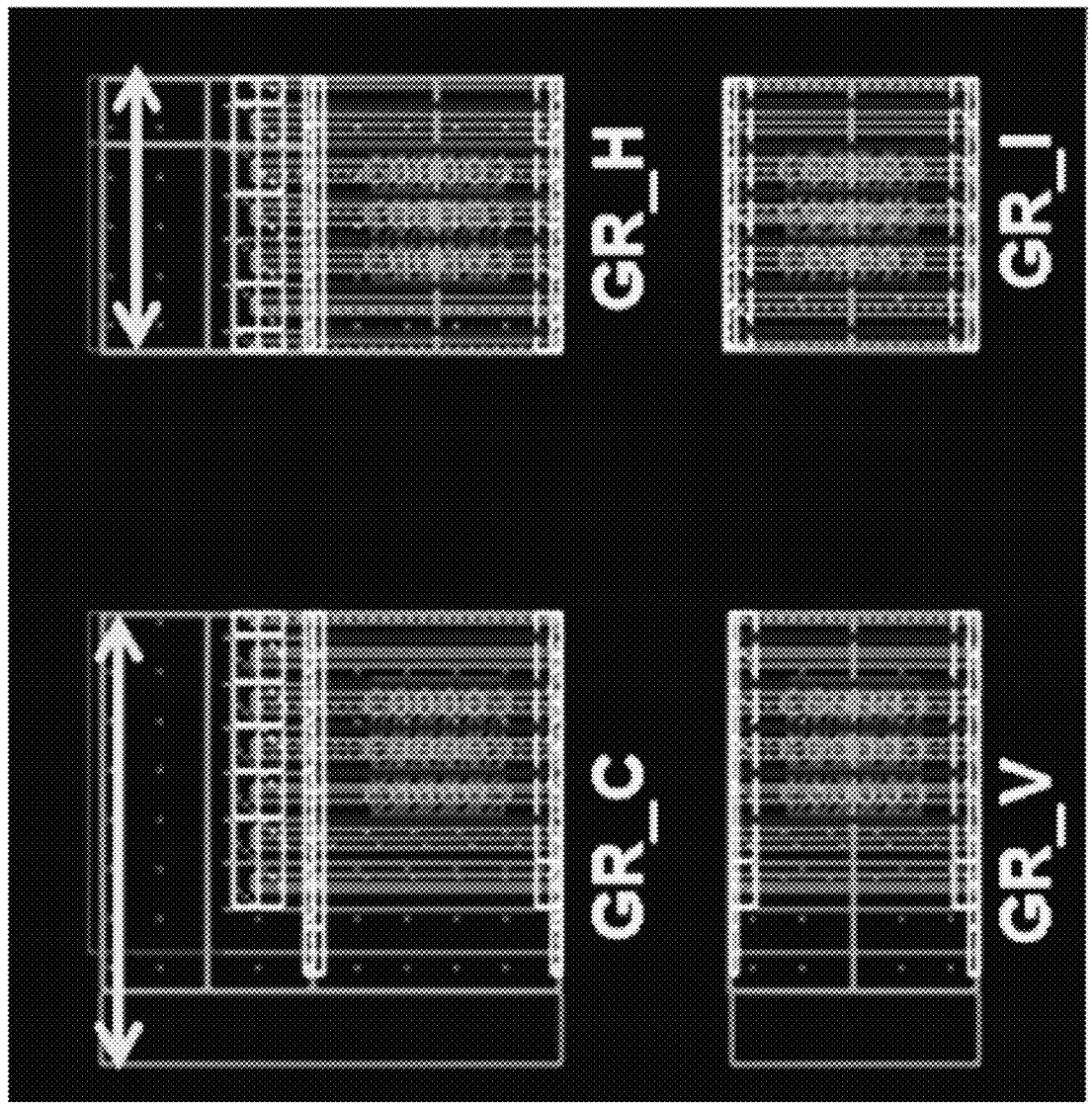
FIG. 2B illustrates exemplary cell layouts of the guard ring cells shown in FIG. 2A in accordance with some embodiments of the present disclosure.

With the use of a suitable/optimized circuit design of a unit cell created based on program code, the circuit design system 110 can provide automated and programmable circuit synthesis to fabricate the integrated circuit. Referring to FIG. 2A, an exemplary circuit floorplan 204 of an integrated circuit 202 is illustrated in accordance with some embodiments of the present disclosure. The integrated circuit 202 can represent an embodiment of the integrated circuit described with reference to the system 100 shown in FIG. 1. In the present embodiment, the integrated circuit 202 can be implemented as, but is not limited to, an analog integrated circuit or an AMS integrated circuit. The integrated circuit 202 has a plurality of unit cells including active circuit cells and guard ring cells. Each active circuit cell, labeled AC_A, can provide electrical signal(s) and functionality. For example, each active circuit cell AC_A may include one or more transistors. The guard ring cells can provide electrical isolation/protection for the active circuit cells AC_A. In the present embodiment, the guard ring cells can be classified into different groups according to cell positions thereof. Each of the guard ring cells GR_C is placed on a corner of the circuit floorplan 204. Each of the guard ring cells GR_H is placed on a horizontal peripheral side of the circuit floorplan 204. Each of the guard ring cells GR_V is placed on a vertical peripheral side of the circuit floorplan 204. Each of the guard ring cells GR_I is placed inside the circuit floorplan 204. FIG. 2B illustrates exemplary cell layouts of the guard ring cells GR_C, GR_H, GR_V and GR_I shown in FIG. 2A in accordance with some embodiments of the present disclosure.

In the embodiment shown in FIG. 2A, each unit cell can be assigned to a circuit block of the circuit floorplan 204 during an automated placement process, which may be enabled when associated instructions of program code are executed. After a cell layout of each unit cell is placed in a circuit block of the circuit floorplan 204, an automated routing process may be enabled to electrically connect the unit cells. For example, after a suitable/optimized cell layout of each unit cell is determined, the program code PROG shown in FIG. 1 may cause the control circuit 112 shown in FIG. 1 to perform automated placement operation and automated routing operation, thereby realizing program-based circuit synthesis.

Figure 3:
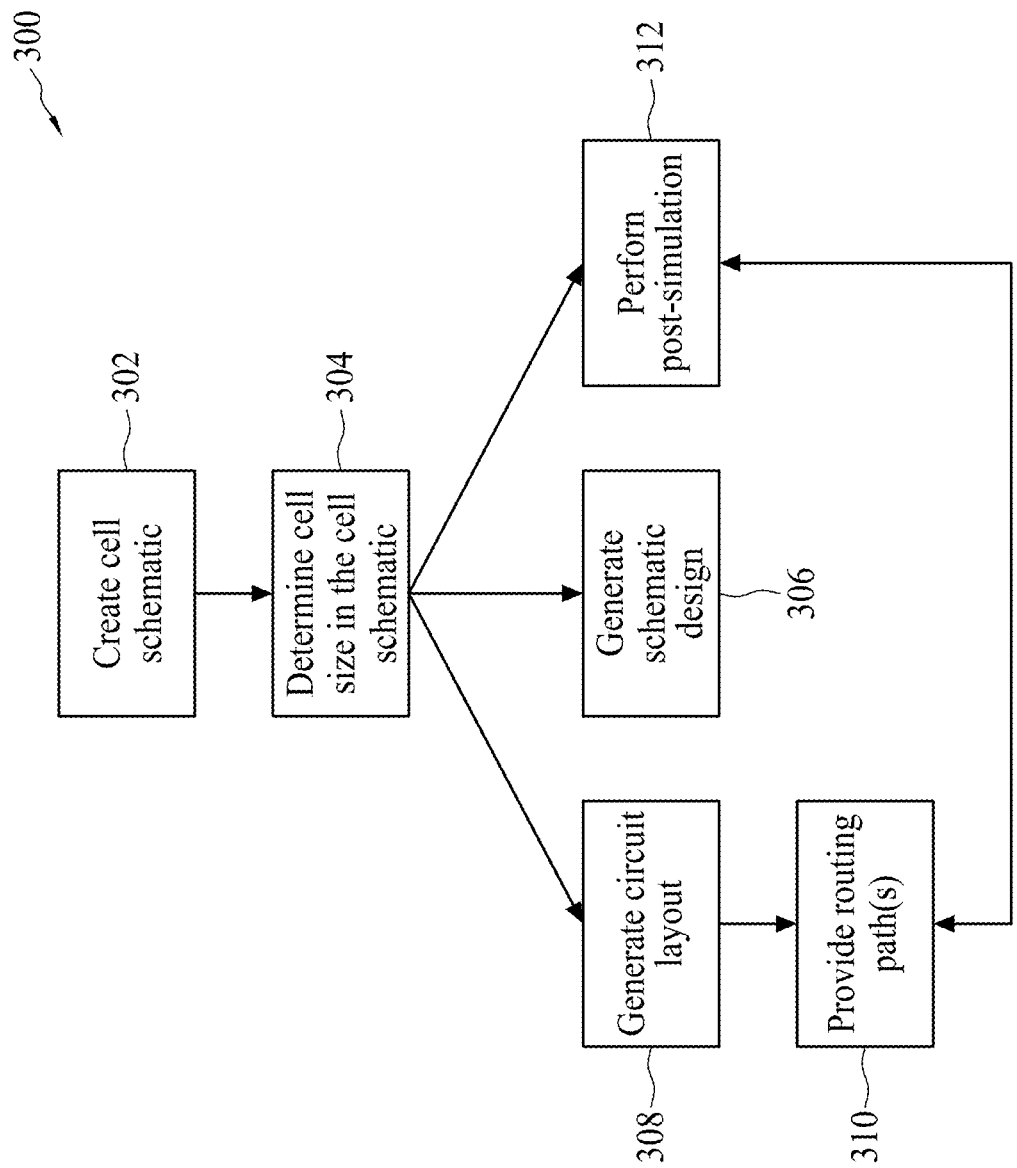
FIG. 3 illustrates a flow chart of an exemplary method for synthesizing an integrated circuit in accordance with some embodiments of the present disclosure.

FIG. 3 illustrates a flow chart of an exemplary method for synthesizing an integrated circuit in accordance with some embodiments of the present disclosure. The method 300 can be employed in the system 100 shown in FIG. 1 to realize a programmable circuit synthesis platform. It is worth noting that the method 300 can be employed in other systems for synthesizing an integrated circuit without departing from the scope of the present disclosure. Additionally, in some embodiments, other operations in the method 300 can be performed. In some other embodiments, operations of the method 300 can be performed in a different order and/or vary. In some other embodiments, one or more operations of the method 300 may be optional.

To facilitate understanding of the present disclosure, the method 300 is described below with reference to the system 100 shown in FIG. 1 together with circuit design representations shown in FIG. 4 to FIG. 8. The circuit design representations shown in FIG. 4 to FIG. 8 are related to an AMS integrated circuit, which can be implemented as a digital-to-analog converter (DAC). However, those skilled in the art will recognize that the method 300 can be used to synthesize integrated circuits having other circuit topologies without departing from the scope of the present disclosure.

At operation 302, a cell schematic of a unit cell of the integrated circuit is created. For example, with reference to FIG. 1 and FIG. 4, the system 100 is configured to fabricate a current-steering DAC including a plurality of unit cells UC. Each unit cell UC may be referred to as a current cell of the current-steering DAC. The control circuit 112 can create a cell schematic CS1 of the unit cell UC, i.e. a schematic representation of the unit cell UC. The cell schematic CS1 can indicate a cell size of the unit cell UC. The I/O module 118 can be configured to display the cell schematic CS1.

In the present embodiment, the unit cell UC includes, but is not limited to, a cascode current source and an output switch. The cascode current source can be implemented by a plurality of transistors M1 and M2. The output switch can be implemented by a transistor M3. The cell size of the unit cell UC in the cell schematic CS1 can be represented by a set of size parameters {sch_para}, which includes at least one transistor size parameter. For example, the set of size parameters {sch_para} of the unit cell UC includes size parameters W1, Nf1, W2 and Nf2, wherein the size parameters W1 and Nf1 represent the channel width and the number of fingers of the transistor M1 respectively, and the size parameters W2 and Nf2 represent the channel width and the number of fingers of the transistor M2 respectively.

The set of size parameters {sch_para} of the unit cell UC in the cell schematic CS1 may be assigned a set of parameter values according to a performance specification provided by the customer. By way of example but not limitation, the performance specification may define an output current of 1 µA. Each of the size parameters W1 and W2 shown in the cell schematic CS1 can be assigned 2 accordingly, meaning that the respective channel widths of the transistors M1 and M2 are set to two times respective channel lengths. The respective channel lengths can be equal to a minimum channel length for a given technology node. Also, each of the size parameters Nf1 and Nf2 shown in the cell schematic CS1 can be assigned 2 accordingly, meaning that the respective numbers of fingers of the transistors M1 and M2 are set to two. The cell schematic CS1 may be regarded as a schematic template.

At operation 304, a set of parameter values for a set of size parameters of the unit cell in the cell schematic is revised according to a predetermined criterion. The unit cell characterized by the revised set of parameter values has a circuit characteristic meeting the predetermined criterion. At operation 306, another cell schematic indicating the revised set of parameter values for the set of size parameters of the unit cell is created.

Figure 5:
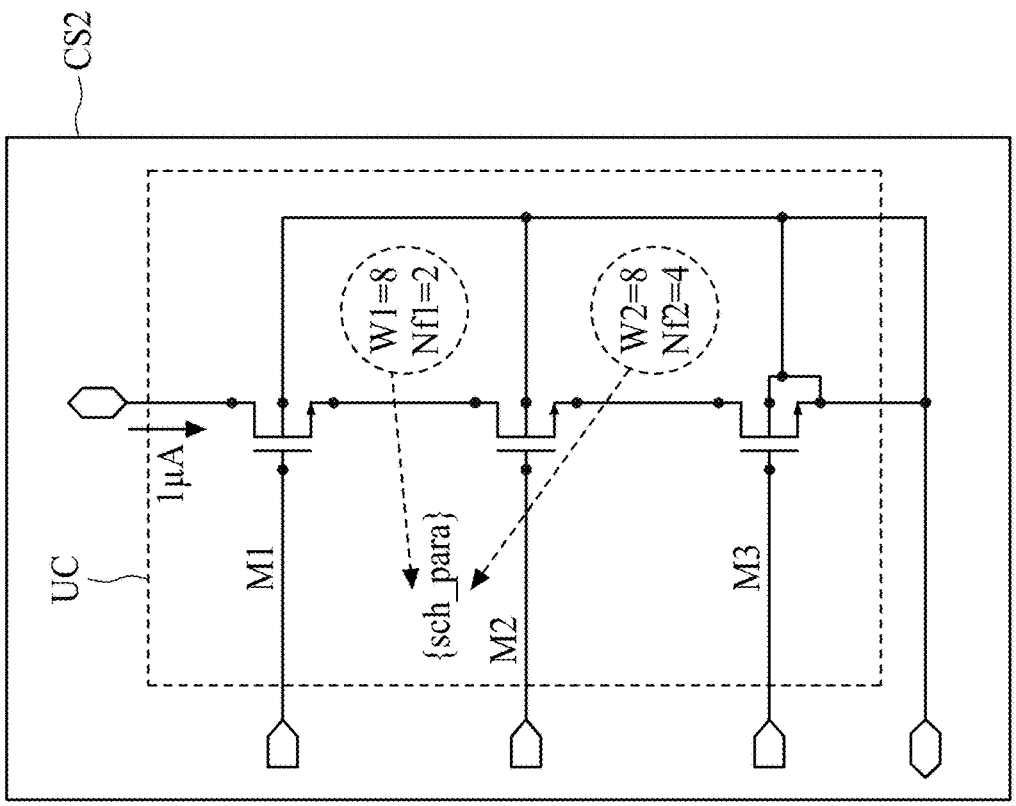
FIG. 5 illustrates an exemplary cell schematic of a unit cell of an integrated circuit in accordance with some embodiments of the present disclosure.
Figure 4:
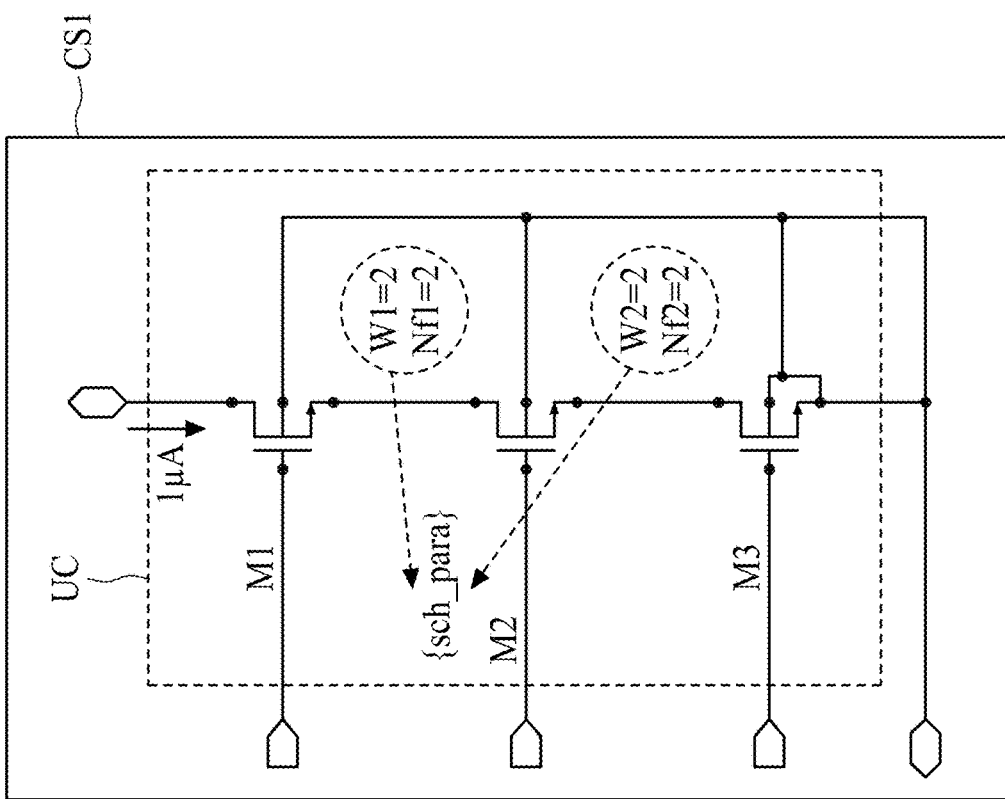
FIG. 4 illustrates an exemplary cell schematic of a unit cell of an integrated circuit in accordance with some embodiments of the present disclosure.

For example, with reference to FIG. 1 and FIG. 5, the control circuit 112 can execute one or more algorithms included in the program code PROG to revise the set of parameter values for the set of size parameters {sch_para} according to a predetermined criterion. The executed one or more algorithms may be one or more AI algorithms, including Decision Trees, Naive Bayes Classifiers, Ensemble Methods, Support Vector Machines and other machine learning algorithms. The unit cell UC characterized by the set of parameter values in the cell schematic CS2 may possess a circuit characteristic meeting the predetermined criterion. The circuit characteristic may include, but is not limited to, a gain value of the unit cell UC. The predetermined criterion can specify a predetermined range of gain values. The predetermined criterion is met when the gain value of the unit cell UC falls within the predetermined range of gain values. After the revised set of parameter values for the set of size parameters {sch_para} is determined according to the predetermined criterion, the control circuit 112 can execute the program code PROG to enable a schematic generator, which can create a cell schematic CS2 according to the revised set of parameter values.

In the present embodiment, the circuit characteristic includes a gain value of the unit cell UC. The predetermined criterion can specify a predetermined range of gain values. The predetermined criterion is met when the gain value of the unit cell UC falls within the predetermined range of gain values. By way of example but not limitation, the predetermined criterion can specify a predetermined range of values for an intrinsic gain of a current source transistor, i.e. the product of transconductance gm and output resistance $r_o$ of the transistor M1/M2. The predetermined criterion is met when a value of the intrinsic gain of the transistor M1/M2 falls within a predetermined range, e.g. $28<gm \times r_o<31$. In the cell schematic CS2, respective parameter values for the size parameters W1 and Nf1 are set to 8 and 2, respectively, such that an intrinsic gain of the transistor M1 has a value falling within the predetermined range. Respective parameter values for the size parameters W2 and Nf2 are set to 8 and 4, respectively, such that an intrinsic gain of the transistor M2 has a value falling within the predetermined range.

It is worth noting that a current-steering DAC having high output impedance can exhibit high linearity. Operating a current source transistor of a DAC unit cell, e.g. the transistor M1/M2, in a saturation region can increase the output impedance of the current-steering DAC. The predetermined criterion, specifying the predetermined range of values for the intrinsic gain of the current source transistor, can ensure that the current source transistor operates in the saturation region, thus realizing the current-steering DAC with high linearity. In addition, the predetermined range specified by the predetermined criterion may vary as long as the current source transistor of the DAC unit cell can operate in the saturation region. By way of example but not limitation, the predetermined range defined by the predetermined criterion may be $gm \times r_o>20$ in some embodiments.

In some embodiments, the control circuit 112 can determine the set of parameter values for the set of size parameters {sch_para} according to a plurality of candidate sets of parameter values for the set of size parameters {sch_para} stored in the circuit design database 116. For example, when executed by the control circuit 112, the program code PROG can cause the control circuit 112 to select a candidate set of parameter values from the candidate sets of parameter values for the set of size parameters {sch_para}. As the unit cell UC characterized by the selected candidate set of parameter values possesses the circuit characteristic meeting the predetermined criterion, the control circuit 112 can use the selected candidate set of parameter values as the revised set of parameter values for the set of size parameters {sch_para} in the cell schematic CS2.

At operation 308, a circuit layout is generated according to the revised set of parameter values for the set of size parameters of the unit cell. In the present embodiment, a cell layout of the unit cell may be generated according to the revised set of parameter values for the set of size parameters of the unit cell. The circuit layout may be generated by assigning the cell layout to each of circuit blocks in a circuit floorplan of the integrated circuit.

Figure 6:
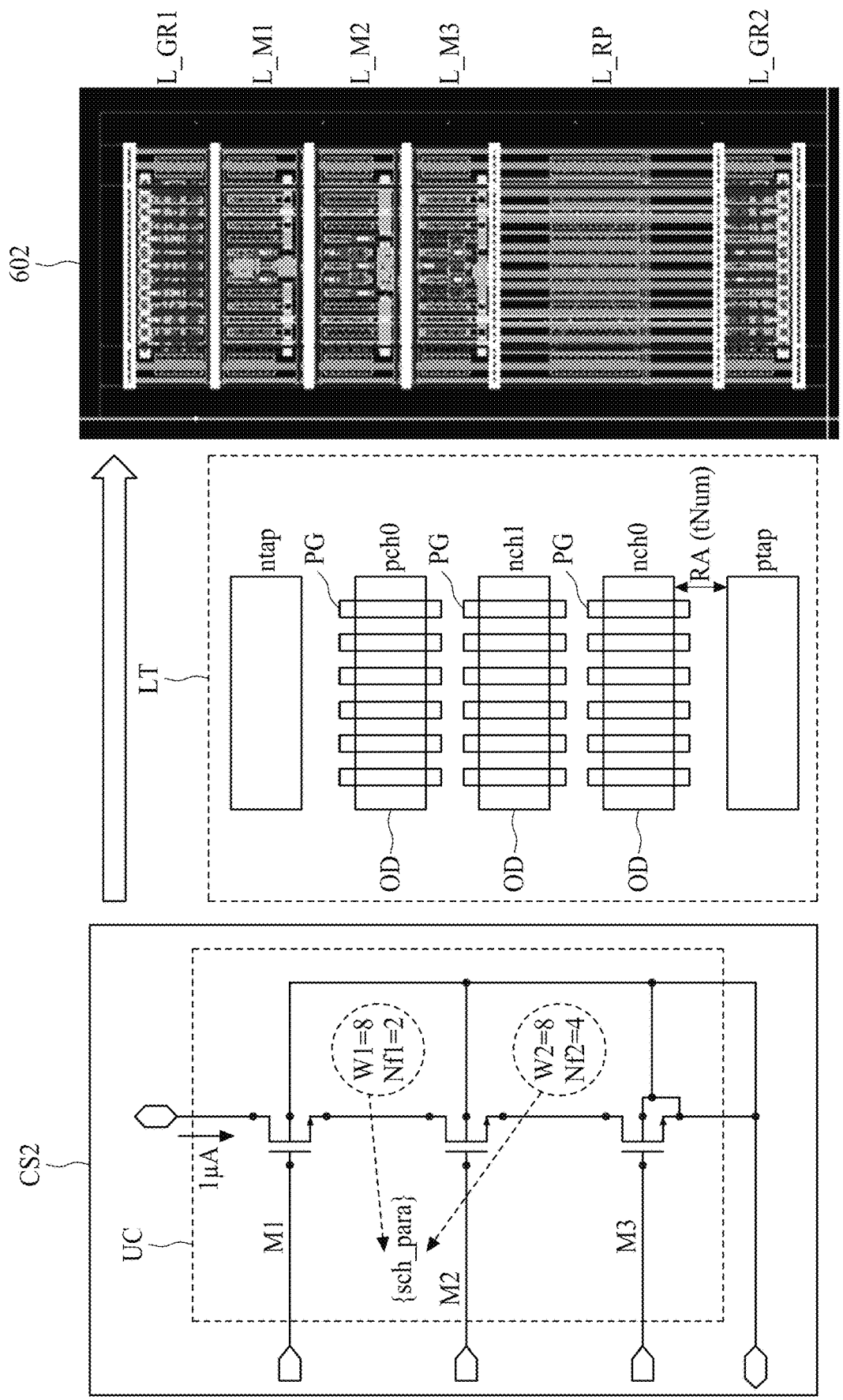
FIG. 6 illustrates an exemplary cell layout transferred from the cell schematic shown in FIG. 5 in accordance with some embodiments of the present disclosure.

For example, referring first to FIG. 1 and FIG. 6, the control circuit 112 can execute the program code PROG to enable a layout generator, which can create a cell layout 602 of the unit cell UC according to the revised set of parameter values for the set of size parameters {sch_para} in the cell schematic CS2. The cell layout 602 includes respective layout structures L_M1-L_M3 of the transistors M1-M3. It is worth noting that the cell layout 602 may further include a plurality of layout structures L_GR1, L_RP and L_GR2. Each of the layout structures L_GR1 and L_GR2 is configured to define a guard ring structure, which is capable of providing electrical isolation/protection for the unit cell UC. The guard ring structures defined by the layout structures L_GR1 and L_GR2 may be tied to a power supply and ground, respectively. The layout structure L_RP is configured to define a track space available for routing. A plurality of electrical interconnection routing paths can be disposed in the track space.

In the present embodiment, the layout generator, or the control circuit 112, can generate the cell layout 602 according to a layout template LT, which is provided in a unit-cell-based layout style. The layout template LT includes a plurality of guard ring areas ntap and ptap, a plurality of transistor areas pch0, nch0 and nch1, and a routing area RA. Each of the guard ring areas ntap and ptap is configured to define a guard ring structure. The layout generator can characterize the guard ring areas ntap and ptap according to the set of parameter values for the set of size parameters {sch_para} in the cell schematic CS2, thereby generating the layout structures L_GR1 and L_GR2, respectively.

Each of the transistor areas pch0, nch0 and nch1 is configured to define a transistor structure. Each transistor area includes an oxide diffusion segment OD and one or more polygate segments PG. The layout generator can characterize the transistor areas pch0, nch0 and nch1 according to the revised set of parameter values for the set of size parameters {sch_para} in the cell schematic CS2, thereby generating the layout structures L_M1-L_M3, respectively.

The routing area RA, located between the transistor area nch0 and the guard ring area ptap, is configured to define a track space available for routing. The track space can be expressed as the number of tracks tNum. The layout generator can determine the number of tracks tNum according to the revised set of parameter values for the set of size parameters {sch_para} in the cell schematic CS2, thereby generating the layout structure L_RP.

When the cell layout 602 of the unit cell UC is created, the layout generator, or the control circuit 112, can generate a circuit layout according to a circuit floorplan and the cell layout 602. Referring to FIG. 1 and also to FIG. 7, the control circuit 112 can execute the program code PROG to assign the cell layout 602 to each of circuit blocks in a circuit floorplan 701 of the integrated circuit, thereby generating a circuit layout 702. As a result, the circuit layout 702, also referred to as a top cell layout, can include a plurality of replicas of the cell layout 602, which are arranged in correspondence with the circuit blocks in the circuit floorplan 701, respectively. In the present embodiment, the integrated circuit can be implemented as, but is not limited to, a 6-bit binary-weighted current-steering DAC having $2^6$ unit cells. The $2^6$ unit cells, or $2^6$ active circuit cells, include $2^5$ first most significant bit (MSB) unit cells, $2^4$ second MSB unit cells, $2^3$ third MSB unit cells, $2^2$ fourth MSB unit cells, $2^1$ fifth MSB unit cells and $2^0$ least significant bit (LSB) unit cell. The $2^6$ unit cells are assigned to $2^6$ circuit blocks in the circuit floorplan 701, respectively. For example, the $2^5$ first MSB unit cells are assigned to $2^5$ circuit blocks (labeled 5), respectively. The $2^4$ second MSB unit cells are assigned to $2^4$ circuit blocks (labeled 4), respectively. The $2^3$ third MSB unit cells are assigned to $2^3$ circuit blocks (labeled 3), respectively. The $2^2$ fourth MSB unit cells are assigned to $2^2$ circuit blocks (labeled 2), respectively. The $2^1$ fifth MSB unit cells are assigned to $2^1$ circuit blocks (labeled 1), respectively. The $2^0$ LSB unit cell are assigned to $2^0$ circuit block (labeled 0). As each of the $2^6$ unit cells can use the cell layout 602 as a cell layout thereof, the cell layout 602 can be assigned to each of the $2^6$ circuit blocks.

The circuit floorplan 701 may further include a plurality of circuit blocks D and a circuit block Gm. Each circuit block D is assigned a dummy cell, which is a unit cell operating as a guard ring cell to provide electrical isolation/protection. In some embodiments, the dummy cell can be used for DAC calibration. The circuit block Gm, located at a reference position in the circuit floorplan 701, can also be assigned a dummy cell. A position where a cell layout of a unit cell is placed in the circuit floorplan 701 can be determined according to the reference position. Other circuit blocks in the circuit floorplan 701 can be symmetrically located with respect to the circuit block Gm, i.e. the reference position. For example, circuit blocks in the circuit 701 are arranged in an array having a plurality of rows ref, dmy1, dmy2 and row1-row6. The reference position can be a center position of the array.

In the present embodiment, circuit blocks in the circuit floorplan 701 may include a plurality of circuit block groups BG1-BG4 arranged in a repeating pattern. By way of example but not limitation, the circuit floorplan 701 can be implemented as a row based floorplan, where circuit elements are placed in rows and channels run horizontally between rows of circuit elements. The circuit block groups BG1 includes a plurality of adjacent circuit blocks, labeled 5, 5, 5, 4 and 5 respectively, located in a row. Each of the rows row1 and row6 can utilize the circuit block group BG1 to construct a same circuit block arrangement. The circuit block groups BG2 includes a plurality of adjacent circuit blocks, labeled 5, 5, 4, 3 and 4 respectively, located in a row. Each of the rows row2 and row5 can utilize the circuit block group BG2 to construct a same circuit block arrangement. The circuit block groups BG3 includes a plurality of adjacent circuit blocks, labeled 5, 4, 3, 2 and 1 respectively, located in a row. Each of the rows row3 and row4 can utilize the circuit block group BG3 to construct a same circuit block arrangement. The circuit block groups BG4 includes a plurality of adjacent circuit blocks, labeled 5, 5, 4 and 0 respectively, located in a row. The row ref can utilize the circuit block group BG4 to construct a circuit block arrangement thereof.

By assigning the cell layout 602 to each circuit block in the circuit block groups BG1-BG4, the control circuit 112 can generate a plurality of cell layout groups LG1-LG4, respectively. In addition, by arranging the cell layout groups LG1-LG4 according to the repeating pattern, the control circuit 112 can generate the circuit layout 702. In the present embodiment, the circuit layout 702 may include a local interconnect structure such as a M0 metal layer.

After a top cell layout, e.g. the circuit layout 702, is generated according to a circuit floorplan and a suitable/optimized unit cell layout, an automated routing process can be enabled in a back-end design stage.

At operation 310, one or more routing paths are provided on the circuit layout to generate a layout design of the integrated circuit. The integrated circuit can be fabricated according to the layout design. For example, with reference to FIG. 1 and FIG. 7, after the circuit layout 702 is generated according to the circuit floorplan 701 and the cell layout 602, the program code PROG can cause the control circuit 112 to enable an automated routing tool. The automated routing tool, also referred to as automatic router, can utilize routing specifications stored in the circuit design database 116 to provide one or more routing paths (not shown in FIG. 7) on the circuit layout 702, thereby generating a layout design of the integrated circuit. The layout design can be a design rule check (DRC) clean and layout versus schematic (LVS) clean layout design. In some embodiments, the routing specifications include the number of routing layers, routing layer coloring, routing wire lengths, routing wire widths, routing wire spacing, orientation of routing wires, and combinations thereof. In some embodiments, the routing specifications include signal net definition, clock net definition, power net definition, and combinations thereof. In some embodiments, the routing specifications include pin name definition, routing mismatch tolerance, routing electromigration (EM) tolerance, voltage levels associated with routing layers, and combinations thereof.

Figure 7:
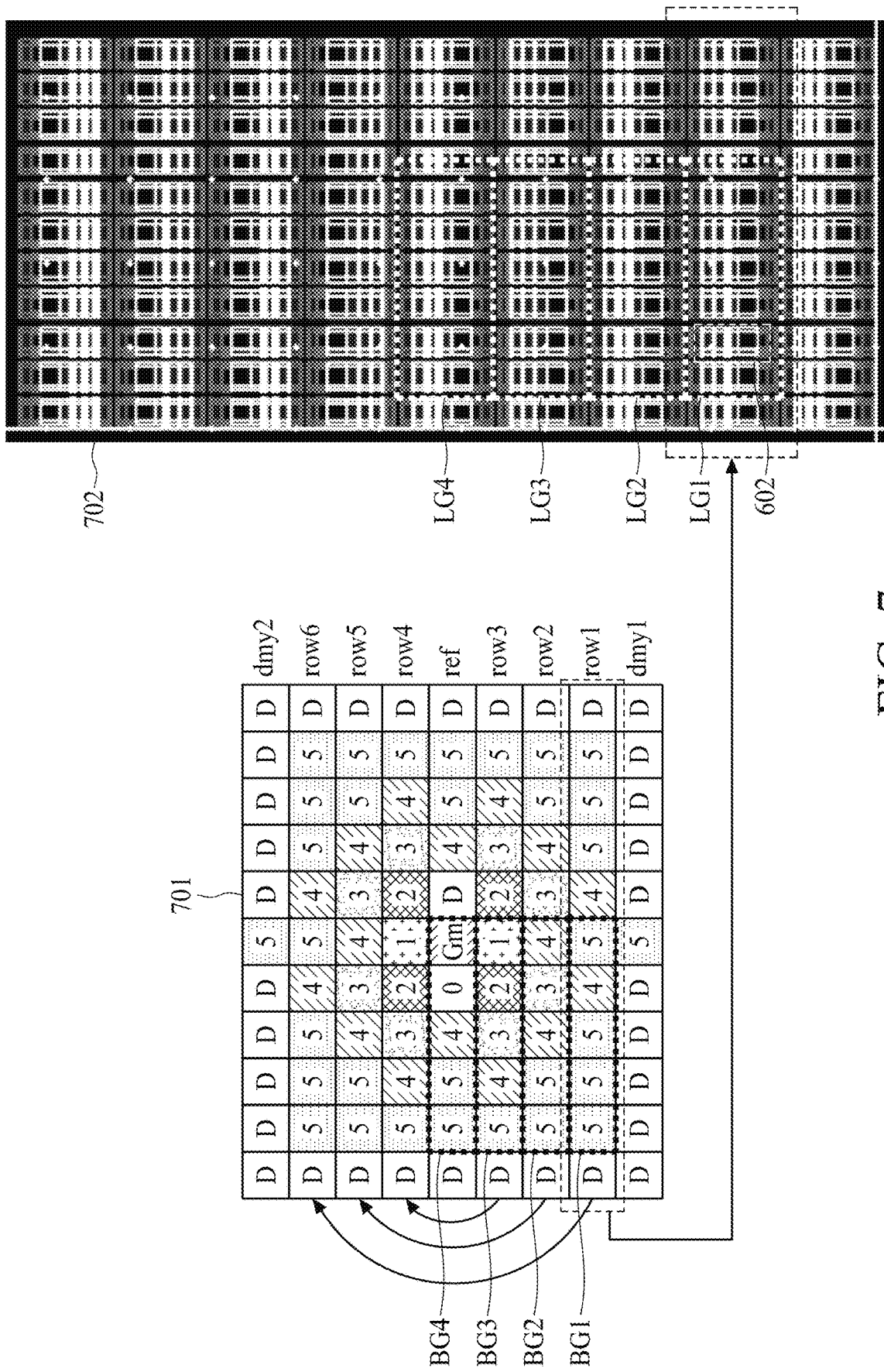
FIG. 7 illustrates an exemplary circuit layout created using the cell layout shown in FIG. 6 in accordance with some embodiments of the present disclosure.

It is worth noting that the layout styles shown in FIG. 6 and FIG. 7 are provided for illustrative purposes, and are not intended to limit the scope of the present disclosure. For example, a top cell layout of the integrated circuit can be created by assigning a unit cell layout, e.g. the cell layout 602, to circuit floorplans having different circuit block topologies.

Figure 8:
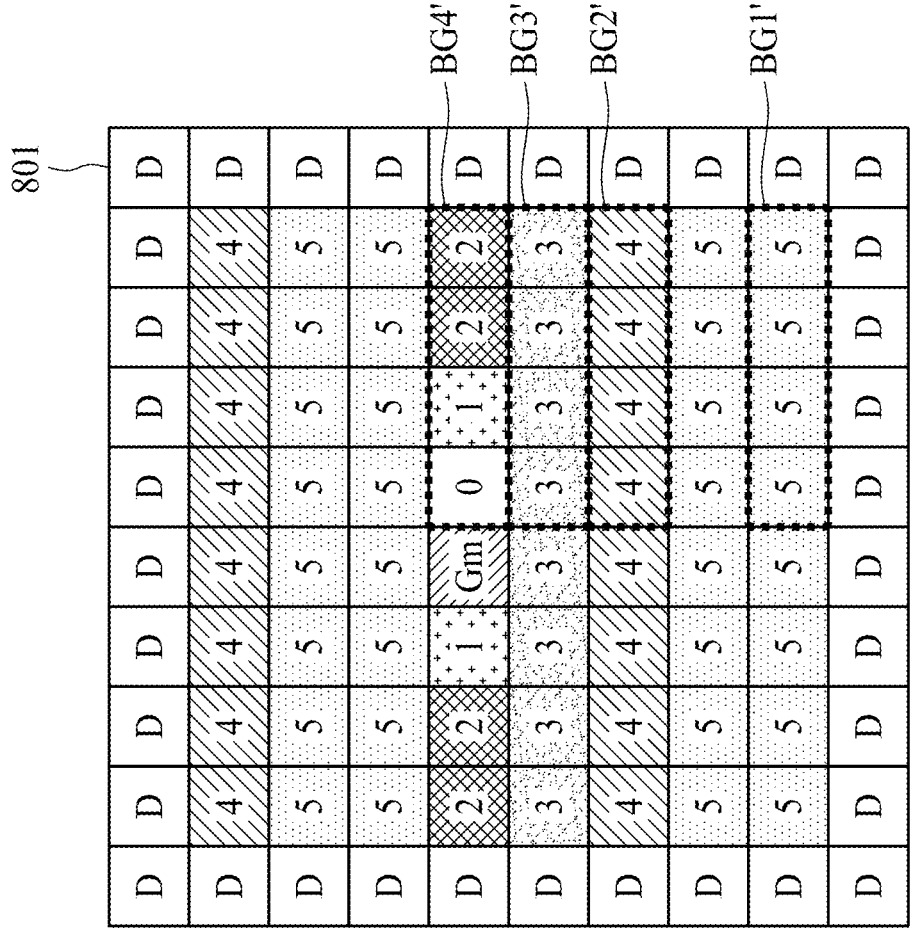
FIG. 8 illustrates an exemplary circuit floorplan of an integrated circuit in accordance with some embodiments of the present disclosure.

Referring to FIG. 8, a circuit floorplan having a circuit block topology different from that of the circuit floorplan 701 shown in FIG. 7 is illustrated in accordance with some embodiments of the present disclosure. In the present embodiment, circuit blocks in the circuit floorplan 801 may include a plurality of circuit block groups BG1'-BG4' arranged in a repeating pattern. In the present embodiment, the circuit block groups BG1' includes a plurality of adjacent circuit blocks, labeled 5, 5, 5 and 5 respectively, located in a row. The circuit block groups BG2' includes a plurality of adjacent circuit blocks, labeled 4, 4, 4 and 4 respectively, located in a row. The circuit block groups BG3' includes a plurality of adjacent circuit blocks, labeled 3, 3, 3 and 3 respectively, located in a row. The circuit block groups BG4' includes a plurality of adjacent circuit blocks, labeled 2, 2, 1 and 0 respectively, located in a row. By assigning a suitable/optimized unit cell layout, such as the cell layout 602 shown in FIG. 6, to each circuit block in the circuit block groups BG1'-BG4', the control circuit 112 shown in FIG. 1 can generate a top cell layout according to the circuit floorplan 801 and the suitable/optimized unit cell layout.

In some embodiments, a schematic design of the integrated circuit can be created in a hierarchical manner at operation 306. For example, a circuit floorplan of the integrated circuit includes rows of circuit blocks. Each row of circuit blocks comprises a plurality of circuit blocks. At operation 306, after the another cell schematic indicating the revised set of parameter values is created, respective block schematics of circuit blocks in each row of circuit blocks are created according to the another cell schematic. Also, a circuit schematic of the row of circuit blocks is created according to the block schematics. According to respective circuit schematics for the rows of circuit blocks, the schematic design of the integrated circuit can be created.

Figure 9:
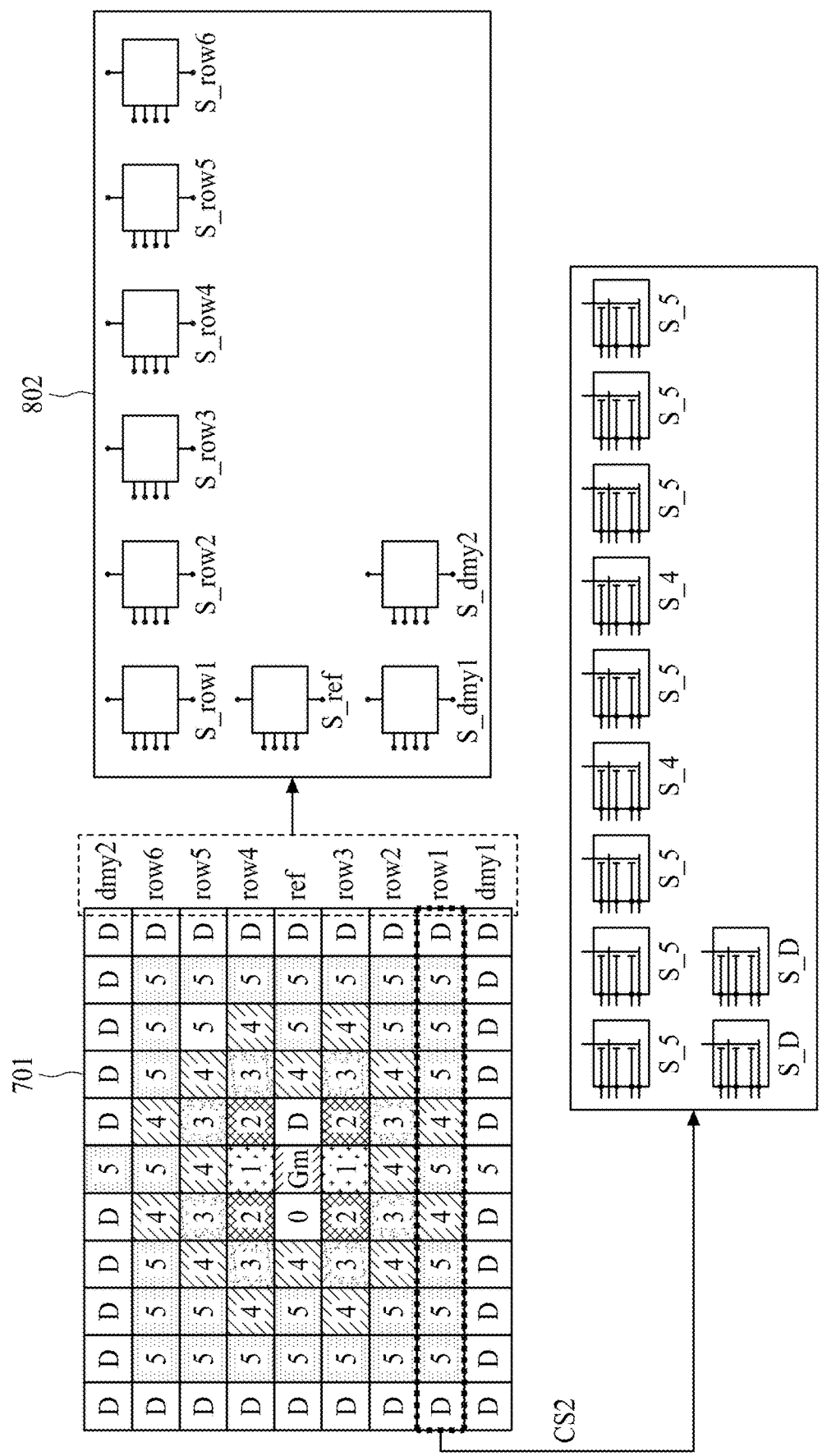
FIG. 9 illustrates an exemplary schematic design created using the cell schematic shown in FIG. 5 in accordance with some embodiments of the present disclosure.

Referring to FIG. 1 and also to FIG. 9, the schematic generator enabled by the control circuit 112 can create respective block schematics of circuit blocks in each row according to the cell schematic CS2, and create a circuit schematic of the row according to the block schematics. As a result, the circuit schematic of the row is a row based schematic created according to the cell schematic CS2. For example, a circuit schematic S_row1 of the row row1 can be created according to the cell schematic CS2. The block schematics included in the circuit schematic S_row1 are arranged in correspondence with the circuit blocks in the row row1, respectively. The block schematic S_5 corresponds to the circuit block labeled 5, and the block schematic S_4 corresponds to the circuit block labeled 4. Also, the block schematic S_D corresponds to the circuit block D which is assigned a dummy cell. After the circuit schematics S_ref, S_dmy1, S_dmy2 and S_row1-S_row6, corresponding to the rows ref, dmy1, dmy2 and row1-row6 respectively, are created, the schematic generator enabled by the control circuit 112 can create a schematic design 802 of the integrated circuit accordingly.

At operation 312, a test bench or a post-simulation is performed. For example, a post-simulation can be performed upon the unit cell characterized by the revised set of parameter values to generate a simulation result. When the simulation result does not satisfy another predetermined criterion, such as a predetermined frequency response, predetermined transient waveforms or other predetermined circuit characteristics, the method 300 returns to operation 304, such that the revised set of parameter values for the set of size parameters of the unit cell can be modified again. Another revised set of parameter values for the set of size parameters is obtained accordingly. The unit cell characterized by the another revised set of parameter values has a circuit characteristic meeting the predetermined criterion.

As another example, a post-simulation can be performed upon the layout design of the integrated circuit to generate a simulation result. When the simulation result does not satisfy another predetermined criterion, such as a predetermined frequency response, predetermined transient waveforms or other circuit characteristics, the method 300 returns to operation 310, such that the layout design of the integrated circuit can be modified.

Figure 10:
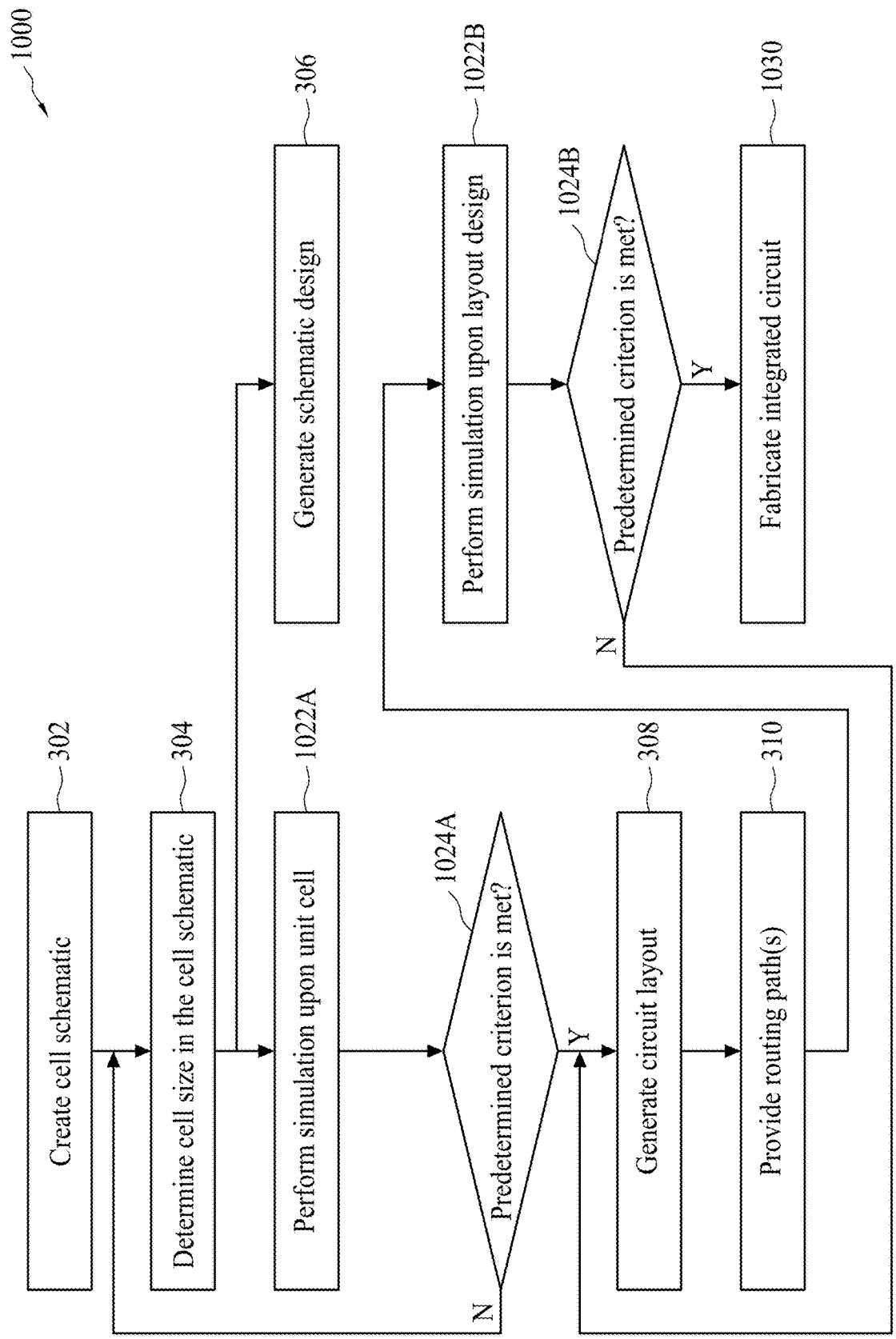
FIG. 10 is a flow chart of an exemplary method for fabricating an integrated circuit in accordance with some embodiments of the present disclosure.

FIG. 10 is a flow chart of an exemplary method for fabricating an integrated circuit in accordance with some embodiments of the present disclosure. The method 1000 can be an embodiment of the method 300. The method 1000 can be employed in the system 100 shown in FIG. 1 to realize a programmable circuit synthesis platform for integrated circuit fabrication. Those skilled in the art should appreciate that the method 1000 can be employed in other systems for fabricating an integrated circuit without departing from the scope of the present disclosure. Additionally, in some embodiments, other operations in the method 1000 can be performed. In some embodiments, operations of the method 1000 can be performed in a different order and/or vary. In some other embodiments, one or more operations of the method 1000 may be optional.

In addition to the operations 302-310 of the method 300 shown in FIG. 3, the method 1000 may include operations 1022A, 1024A, 1022B, 1024B and 1030. The operations 1022A, 1024A, 1022B and 1024B can be an embodiment of the operation 312 shown in FIG. 3.

At operation 1022A, after the revised set of parameter values for the set of size parameters is determined according to the predetermined criterion at operation 304, the control circuit 112 can perform a simulation upon the unit cell characterized by the revised set of parameter values to generate a first simulation result.

At operation 1024A, the control circuit 112 can determine if the first simulation result satisfies another predetermined criterion, such as a predetermined frequency response, predetermined transient waveforms or other predetermined circuit characteristics. If the first simulation result satisfies the another predetermined criterion, the method 1000 proceeds to operation 308; otherwise, the method 1000 returns to operation 304.

At operation 1022B, after the layout design of the integrated circuit is generated at operation 304, the control circuit 112 can perform another simulation upon the layout design to generate a second simulation result.

At operation 1024B, the control circuit 112 can determine if the second simulation result satisfies another predetermined criterion, such as a predetermined frequency response, predetermined transient waveforms or other predetermined circuit characteristics. If the second simulation result satisfies the another predetermined criterion, the method 1000 proceeds to operation 1030; otherwise, the method 1000 returns to operation 310.

At operation 1030, the circuit design system 110 can provide the design information DI including the layout design of the integrated circuit. The circuit generation system 120 can fabricate the integrated circuit according to the design information DI.

In some embodiments, the operations 302-308, 1022A and 1024A can be performed at a front-end design stage to create a suitable/optimized top cell layout. In some embodiments, the operations 310, 1022B and 1024B can be performed at a back-end design stage to enable an automated routing process.

With the use of a suitable/optimized circuit design of a unit cell created based on program code, the circuit design system 110 can generate a suitable/optimized circuit design of the integrated circuit without timing consuming trial-and-error iterations. Also, with the use of automated floorplanning and routing, the circuit design system 100 can save layout efforts in passing DRC introduced by advanced technology nodes. Further, the circuit design system 100 can make easier transfer from a schematic design to a layout design for advanced technology nodes.

Figure 11:
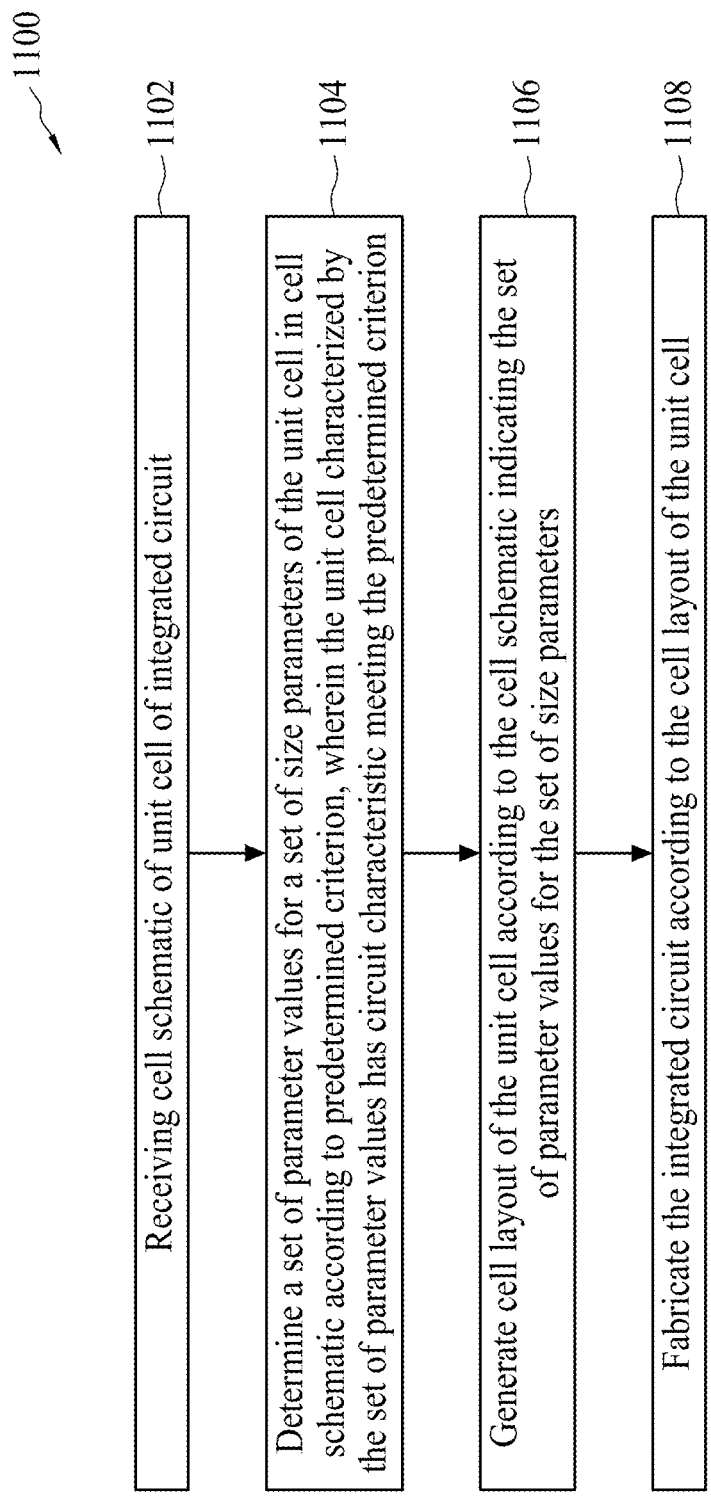
FIG. 11 is a flow chart of an exemplary method for fabricating an integrated circuit in accordance with some embodiments of the present disclosure.

FIG. 11 is a flow chart of an exemplary method for fabricating an integrated circuit in accordance with some embodiments of the present disclosure. The method 1100 can be an embodiment of the method 300. The method 1100 is described with reference to the system 100 shown in FIG. 1 for illustrative purposes. Those skilled in the art should appreciate that the method 1100 can be employed in other systems for fabricating an integrated circuit without departing from the scope of the present disclosure. Additionally, in some embodiments, other operations in the method 1100 can be performed. In some embodiments, operations of the method 1100 can be performed in a different order and/or vary. In some other embodiments, one or more operations of the method 1100 may be optional.

At operation 1102, a cell schematic of a unit cell of the integrated circuit is received. The unit cell can be an analog circuit cell or an AMS circuit cell of the integrated circuit. For example, the control circuit 112 can receive a schematic data input from the circuit designer to create a cell schematic of a unit cell. As another example, the control circuit 112 can select a schematic template stored in the circuit design database 116 as the cell schematic of the unit cell. The schematic template has a cell structure identical to that of the unit cell. In some embodiments, at least part of the operation 1102 can be implemented by the operation 302 shown in FIG. 3.

At operation 1104, a set of parameter values for a set of size parameters of the unit cell in the cell schematic is determined according to a predetermined criterion. The unit cell characterized by the set of parameter values has a circuit characteristic meeting the predetermined criterion. For example, by revising a set of parameter values for the set of size parameters {sch_para} indicated in the cell schematic CS1 shown in FIG. 4 according to a predetermined criterion, the control circuit 112 can determine a set of parameter values for the set of size parameters {sch_para} indicated in the cell schematic CS2 shown in FIG. 5. As another example, after received a performance specification provided by the customer, the control circuit 112 can assign/determine a set of parameter values for the set of size parameters {sch_para} shown in FIG. 5 according to a predetermined criterion rather than create the cell schematic CS1 shown in FIG. 4 in advance, thereby creating the cell schematic CS2 of the unit cell UC shown in FIG. 5. In some embodiments, at least part of the operation 1104 can be implemented by the operation 304 shown in FIG. 3.

At operation 1106, a cell layout of the unit cell is generated according to the cell schematic indicating the set of parameter values for the set of size parameters. For example, the control circuit 112 can execute the program code PROG to enable a layout generator. The layout generator can create a unit cell layout, such as the cell layout 602 shown in FIG. 6, according to the determined set of parameter values for the set of size parameters.

In some embodiments, a circuit layout can be generated by assigning the unit cell layout to each of circuit blocks in a circuit floorplan of the integrated circuit. The integrated circuit can be generated according to the circuit layout. For example, with reference to FIG. 1 and FIG. 7, the layout generator enabled by the control circuit 112 can assign the cell layout 602 to each circuit blocks in the circuit floorplan 701 to generate the circuit layout 702, which can be used for fabricating the integrated circuit. In some embodiments, at least part of the operation 1106 can be implemented by the operation 308 shown in FIG. 3.

At operation 1108, the integrated circuit is fabricated according to the cell layout of the unit cell. For example, the circuit generation system 120 can fabricate the integrated circuit according to the design information DI, which includes design data associated with a layout design of the integrated circuit. The layout design of the integrated circuit is created according to a unit cell layout.

Figure 12:
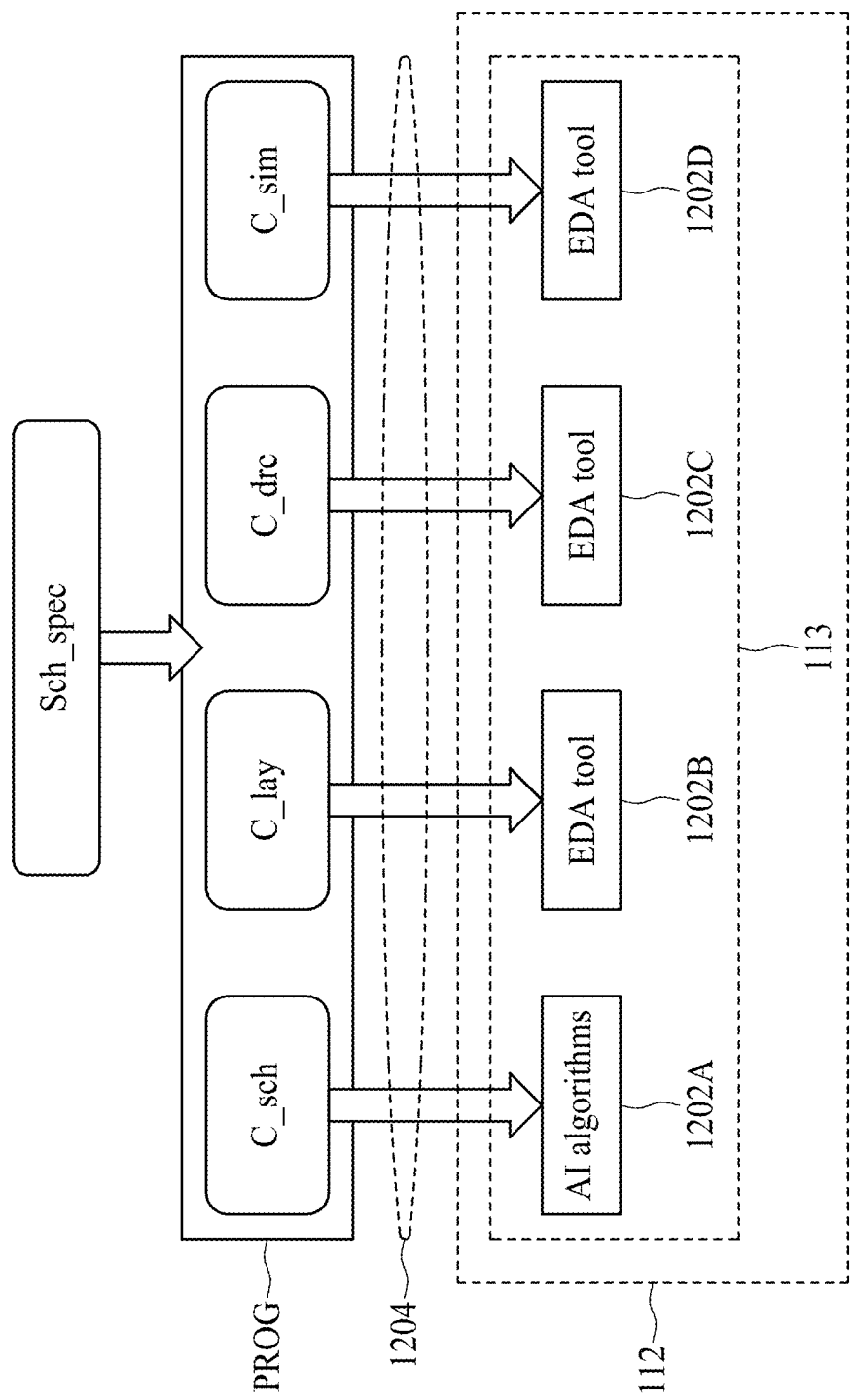
FIG. 12 illustrates an implementation of the control circuit and the program code shown in FIG. 1 in accordance with some embodiments of the present disclosure.

FIG. 12 illustrates an implementation of the control circuit 112 and the program code PROG shown in FIG. 1 in accordance with some embodiments of the present disclosure. In the present embodiment, the control circuit 112 and the program code PROG can be used to implement an analog design generator capable of providing a programmable analog synthesis platform. The program code PROG includes code C_sch for optimizing a schematic design, code C_lay for optimizing a layout design, code C_drc for DRC/LVS, and code C_sim for post-simulation. Input arguments Sch_spec supplied to the program code PROG may include, but is not limited to, specification data and design data associated with a schematic template.

When executed by the control circuit 112, the code C_sch can cause the control circuit 112 to launch AI algorithms 1202A, or designer-defined code, for schematic optimization by calling an application programming interface (API) 1204. When executed by the control circuit 112, the code C_lay can cause the control circuit 112 to launch an EDA tool 1202B for layout optimization included in the circuit design tool 113 through API calls. When executed by the control circuit 112, the code C_drc can cause the control circuit 112 to launch an EDA tool 1202C for DRC/LVS included in the circuit design tool 113 through API calls. When executed by the control circuit 112, the code C_sim can cause the control circuit 112 to launch an EDA tool 1202D for post-simulation included in the circuit design tool 113 through API calls.

With the use of the programmable analog synthesis platform, the system 100 can realize automated analog design synthesis.

Some embodiments described herein may include a method for fabricating an integrated circuit. The method includes: receiving a cell schematic of a unit cell of the integrated circuit; when an intrinsic gain of a transistor of the unit cell falls outside a predetermined range of gain values, revising a set of parameter values for a set of size parameters of the unit cell in the cell schematic, wherein the intrinsic gain of the transistor of the unit cell characterized by the revised set of parameter values falls within the predetermined range of gain values; generating a cell layout of the unit cell according to the cell schematic indicating the revised set of parameter values for the set of size parameters; and fabricating the integrated circuit according to the cell layout of the unit cell.

Some embodiments described herein may include a method for fabricating an integrated circuit. The method includes: assigning a set of parameter values to a set of size parameters of a unit cell of the integrated circuit in a unit cell schematic of the unit cell by referring to an intrinsic gain of at least one transistor of unit cell, wherein the intrinsic gain of the at least one transistor of the unit cell, characterized by the set of parameter values, is set to a gain value falling within a predetermined range; generating a unit cell layout of the unit cell according to the unit cell schematic; generating a circuit layout comprising a plurality of replicas of the unit cell layout, the replicas of the unit cell layout being arranged in correspondence with circuit blocks in a circuit floorplan of the integrated circuit, respectively; and fabricating the integrated circuit according to the circuit layout.

Some embodiments described herein may include a system for fabricating an integrated circuit. The system includes a control circuit and a storage device. The storage device, coupled to the control circuit, is configured to store a circuit design database and a program code. The circuit design database stores a plurality of circuit characteristics corresponding to a unit cell of the integrated circuit. A plurality of candidate sets of parameter values for a set of size parameters of the unit cell are used to characterize the unit cell to obtain the circuit characteristics, respectively. When executed by the control circuit, the program code causes the control circuit to: create a first cell schematic of the unit cell, the set of size parameters of the unit cell being assigned a set of parameter values, the unit cell in the first cell schematic characterized by the set of parameter values; create a second cell schematic of the unit cell according to the circuit design database by revising the set of parameter values of the unit cell in the first cell schematic according to an intrinsic gain of at least one transistor of the unit cell, wherein the set of size parameters of the unit cell in the second cell schematic has one of the candidate set of parameter values, the intrinsic gain of the at least one transistor of the unit cell characterized by the set of parameter values is set to a gain value falling within a predetermined range; generate a cell layout of the unit cell according to the second cell schematic; and fabricate the integrated circuit according to the cell layout of the unit cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, comprising:
   receiving a cell schematic of a unit cell of the integrated circuit;
   when an intrinsic gain of a transistor of the unit cell falls outside a predetermined range of gain values, revising a set of parameter values for a set of size parameters of the unit cell in the cell schematic, wherein the intrinsic gain of the transistor of the unit cell characterized by the revised set of parameter values falls within the predetermined range of gain values;
   generating a cell layout of the unit cell according to the cell schematic indicating the revised set of parameter values for the set of size parameters; and
   fabricating the integrated circuit according to the cell layout of the unit cell.

2. The method of claim 1, wherein the transistor of the unit cell characterized by the revised set of parameter values operates in a saturation region.

3. The method of claim 1, wherein revising the set of parameter values for the set of size parameters of the unit cell in the cell schematic comprises:
   revising at least one of a channel width and a number of fingers of the transistor.

4. The method of claim 1, wherein revising the set of parameter values for the set of size parameters of the unit cell in the cell schematic comprises:
   selecting a candidate set of parameter values from a plurality of candidate sets of parameter values for the set of size parameters, wherein the intrinsic gain of the transistor of the unit cell characterized by the candidate set of parameter values falls within the predetermined range of gain values; and
   using the candidate set of parameter values as the set of para values for the set of size parameters of the unit cell in the cell schematic.

5. The method of claim 1, wherein revising the set of parameter values for the set of size parameters of the unit cell in the cell schematic comprises:
   revising at least one of a channel width and a number of fingers of the transistor.

6. The method of claim 1, wherein generating the cell layout of the unit cell according to the cell schematic indicating the revised set of parameter values for the set of size parameters comprises:
   generating the cell layout of the unit cell according to a layout template characterized by the revised set of parameter values for the set of size parameters, wherein the layout template comprises a transistor area, a guard ring area, and a routing area located between the transistor area and the guard ring area.

7. The method of claim 1, wherein fabricating the integrated circuit according to the cell layout of the unit cell comprises:
   generating a circuit layout by assigning the cell layout to each of circuit blocks in a circuit floorplan of the integrated circuit; and
   fabricating the integrated circuit according to the circuit layout.

8. The method of claim 7, wherein the circuit blocks are symmetrically located with respect to a reference position in the circuit floorplan.

9. The method of claim 7, wherein the circuit blocks comprise a plurality of circuit block groups arranged in a repeating pattern; generating the circuit layout by assigning the cell layout to each of the circuit blocks in the circuit floorplan comprises:
   generating a plurality of cell layout groups by assigning the cell layout to each circuit block in the circuit block groups, respectively; and
   generating the circuit layout by arranging the cell layout groups according to the repeating pattern.

10. The method of claim 7, wherein fabricating the integrated circuit according to the circuit layout comprises:
    providing one or more routing paths on the circuit layout to generate a layout design of the integrated circuit; and
    fabricating the integrated circuit according to the layout design.

11. The method of claim 1, wherein a circuit floorplan of the integrated circuit comprises rows of circuit blocks; each row of circuit blocks comprises a plurality of circuit blocks; the method further comprises:
    creating respective block schematics of the circuit blocks in the row of circuit blocks according to the cell schematic of the unit cell characterized by the revised set of parameter values;
    creating a circuit schematic of the row of circuit blocks according to the block schematics; and
    creating a schematic design of the integrated circuit according to the circuit schematic.

12. The method of claim 1, wherein the unit cell is an analog circuit cell or an analog/mixed-signal (AMS) circuit cell of the integrated circuit.

13. A method for fabricating an integrated circuit, comprising:
    assigning a set of parameter values to a set of size parameters of a unit cell of the integrated circuit in a unit cell schematic of the unit cell by referring to an intrinsic gain of at least one transistor of unit cell, wherein the intrinsic gain of the at least one transistor of the unit cell, characterized by the set of parameter values, is set to a gain value falling within a predetermined range;
    generating a unit cell layout of the unit cell according to the unit cell schematic;
    generating a circuit layout comprising a plurality of replicas of the unit cell layout, the replicas of the unit cell layout being arranged in correspondence with circuit blocks in a circuit floorplan of the integrated circuit, respectively; and
    fabricating the integrated circuit according to the circuit layout.

14. The method of claim 13, wherein the predetermined range is determined according to whether the at least one transistor of the unit cell, characterized by the set of parameter values, operates in a saturation region.

15. The method of claim 13, wherein the set of size parameters of the unit cell in the cell schematic comprises at least one of a channel width and a number of fingers of the at least one transistor.

16. The method of claim 13, wherein a plurality of circuit characteristics corresponding to the unit cell characterized by a plurality of candidate sets of parameter values, respectively, are stored in a circuit design database; assigning the set of parameter values to the set of size parameters of the unit cell in the unit cell schematic according to the predetermined criterion comprises:
   selecting a candidate set of parameter values from the candidate sets of parameter values according to the circuit design database, the unit cell characterized by the candidate set of parameter values has the circuit characteristic meeting the predetermined criterion; and
   using the candidate set of parameter values as the set of parameter values of the unit cell in the cell schematic.

17. The method of claim 13, wherein the circuit blocks comprises a plurality of circuit block groups arranged in a repeating pattern; generating the circuit layout comprising the replicas of the unit cell layout comprises:
   generating respective cell layout groups of the circuit block groups, each circuit block in each of the cell layout groups being assigned a replica of the unit cell layout; and
   generating the circuit layout by arranging the cell layout groups according to the repeating pattern.

18. A system for fabricating an integrated circuit, comprising:
   a control circuit;
   a storage device, coupled to the control circuit, the storage device being configured to store a circuit design database and a program code, wherein the circuit design database stores a plurality of circuit characteristics corresponding to a unit cell of the integrated circuit, and a plurality of candidate sets of parameter values for a set of size parameters of the unit cell are used to characterize the unit cell to obtain the circuit characteristics, respectively; when executed by the control circuit, the program code causes the control circuit to:
   create a first cell schematic of the unit cell, the set of size parameters of the unit cell being assigned a set of parameter values, the unit cell in the first cell schematic characterized by the set of parameter values;
   create a second cell schematic of the unit cell according to the circuit design database by revising the set of parameter values of the unit cell in the first cell schematic according to an intrinsic gain of at least one transistor of the unit cell, wherein the set of size parameters of the unit cell in the second cell schematic has one of the candidate set of parameter values, the intrinsic gain of the at least one transistor of the unit cell characterized by the set of parameter values is set to a gain value falling within a predetermined range;
   generate a cell layout of the unit cell according to the second cell schematic; and
   fabricate the integrated circuit according to the cell layout of the unit cell.

19. The system of claim 18, wherein the at least one transistor, having the intrinsic gain set to the gain value of the unit cell, operates in a saturation region.

20. The system of claim 18, wherein when executed by the control circuit, the program code causes the control circuit to generate a circuit layout by assigning the cell layout to each of circuit blocks in a circuit floorplan of the integrated circuit, and refer to the circuit layout to fabricate the integrated circuit.

* * * * *